United States Patent [19]

Smith et al.

[11] Patent Number: 5,414,514
[45] Date of Patent: May 9, 1995

[54] ON-AXIS INTERFEROMETRIC ALIGNMENT OF PLATES USING THE SPATIAL PHASE OF INTERFERENCE PATTERNS

[75] Inventors: Henry I. Smith, Sudbury; Alberto M. Modiano, Cambridge; Euclid E. Moon, Boston, all of Mass.

[73] Assignee: Massachusetts Institute of Technology, Cambridge, Mass.

[21] Appl. No.: 69,998

[22] Filed: Jun. 1, 1993

[51] Int. Cl.$^6$ ............................ G01B 9/02; G01V 9/04
[52] U.S. Cl. ............................ 356/363; 356/356; 356/401; 250/548
[58] Field of Search ............... 356/354, 356, 363, 401, 356/400; 250/548, 557, 237 G

[56] References Cited

U.S. PATENT DOCUMENTS

| | | | |
|---|---|---|---|
| 4,340,305 | 7/1982 | Smith et al. | 356/356 |
| 4,779,001 | 10/1988 | Makosch | 355/401 |
| 4,815,854 | 3/1989 | Tanaka et al. | 356/401 |
| 4,991,962 | 2/1991 | Jain | 356/356 |
| 5,189,494 | 2/1993 | Muraki | 356/401 |
| 5,216,257 | 6/1993 | Brueck et al. | 356/401 |

FOREIGN PATENT DOCUMENTS

1-89328  4/1989  Japan ........................... 356/363

OTHER PUBLICATIONS

Jahns et al., "Precise Alignment Through Thick Wafers Using an Optical Copying Technique", Optics Letters, vol. 17, No. 6, Mar. 15, 1992.

Flanders et al., "A New Interferometric Alignment Technique", Applied Physics Letters, vol. 31, No. 7, Oct. 1, 1977.

Kinoshita et al., "A Dual Grating Alignment Technique for X-ray Lithography", J. Vac. Sci. Technol. B, vol. 1, No. 4, Dec. 1983.

*Primary Examiner*—Rolf Hille
*Assistant Examiner*—Minhloan Tran
*Attorney, Agent, or Firm*—Fish & Richardson

[57] ABSTRACT

There are first and second relatively movable plates. On a face of each of the first and second plates, there are first and second alignment marks, each being a linear grating of parallel lines of uniform spatial period, the spatial periods being different from each other. There is a light source for illuminating the linear grating on the second plate through the linear grating on the first plate to produce an interference pattern. Indicia on the first or second plates indicate a periodic reference pattern having a phase. A detector is configured to detect when the spatial phase of the interference pattern and the spatial phase of said reference pattern differ by a predetermined value. A position adjustor is for adjusting the relative position of the first and second plates until the detector detects said phase difference.

18 Claims, 8 Drawing Sheets

ON-AXIS INTERFEROMETRIC ALIGNMENT OF PLATES USING THE SPATIAL PHASE OF INTERFERENCE PATTERNS

STATEMENT AS TO RIGHTS IN THE INVENTION MADE UNDER FEDERAL SPONSORSHIP

This invention was made with government support under research grant number ECS-9016437 awarded by the National Science Foundation. The government has certain rights in the invention.

BACKGROUND OF THE INVENTION

This invention relates to a means for aligning, by optical means, one substantially planar object (hereafter called the mask) with respect to a second planar object (hereafter called the substrate). The invention achieves a high degree of sensitivity, accuracy and reliability through a novel design of alignment marks located on both the mask and the substrate.

In the practice of microlithography, such as in the manufacture of integrated circuits, it is often necessary to expose a pattern in a resist film on top of a preexisting pattern on the substrate. Generally, the latter pattern had itself utilized microlithography for its creation. This superposition of one pattern on top of another is generally referred to as "alignment". Often it is necessary to align the upper pattern on top of the lower pattern to within a small fraction (e.g. one fourth to one one-hundredth) of the minimum feature size achieved by the microlithography process. Thus, for example, if a microlithography process for fabricating integrated circuits is designed to yield a minimum linewidth of 1 micrometer, the requirement on alignment would typically be that critical pattern levels be aligned with respect to one another with a deviation from perfect superposition of less than $\frac{1}{4}$ to 1/10 of a micrometer.

Many methods have been developed for the alignments of one level of microlithography to another. Typically, "alignment marks", such as crosses or rectangles, are created on the mask, and complementary marks are inscribed in the substrate. In proximity printing techniques, such as x-ray lithography, alignment is usually done by viewing both marks through an alignment microscope. In optical-projection lithography the images of the substrate alignment marks are sometimes projected, via a lens, onto the mask (generally, in this case, referred to as a reticle). Such schemes are sometimes referred to as "amplitude" alignment schemes.

In the mid 1970's, H. I. Smith and co-workers described an interferometric alignment scheme in which beams of light diffracted from gratings located on the mask and the substrate were made to interfere, and the intensity of this interference was interpreted to yield a measure of the alignment. This interferometric scheme is described in U.S. Pat. Nos. 4,200,395 and 4,340,305 granted to H. I. Smith, S. S. Austin and D. C. Flanders, incorporated by reference herein.

There were a number of shortcomings with this interferometric alignment scheme. Some were circumvented by subsequent developments in Japan, notably the use of two-frequency lasers and heterodyne techniques. However, the performance of heterodyne interferometric schemes, although able to detect misalignment of the order of 5 nm under carefully controlled experimental conditions, was deficient in more realistic experiments.

It is therefore an object of this invention to improve the performance that can be achieved with optical alignment systems under practical working conditions.

SUMMARY OF THE INVENTION

According to the invention, alignment marks on mask and substrate consist of one or more simple periodic gratings. A grating on the mask, having a period or pitch $p_1$, is paired up with a grating on the substrate that has a slightly different period, $p_2$. Since the characteristic angles of diffraction from the two gratings differ, interference patterns are discernible where diffracted beams overlap. The phase of this interference pattern (which is sometimes called a moiré pattern) is brought into a predetermined relationship with the phase of a reference pattern.

Numerous other features, objects and advantages of the invention will become apparent from the following detailed description when read in connection with the accompanying drawings in which:

DETAILED DESCRIPTION

Figure 1:
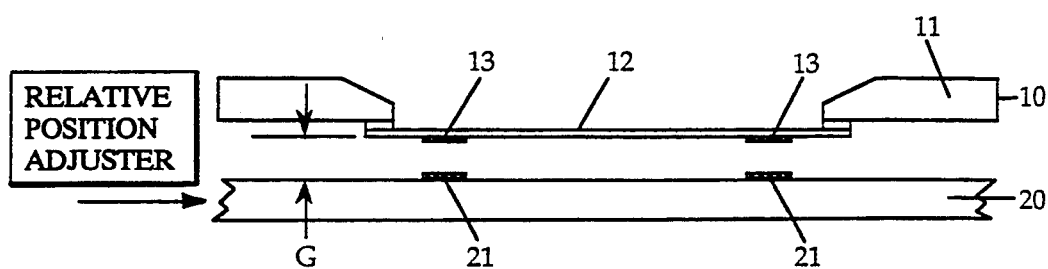
FIG. 1 is a cross-sectional view of a mask and substrate.

With reference to the drawings, FIG. 1 shows a cross sectional view of x-ray mask 10 separated from substrate 20 by a small gap, G. The mask 10 includes a support frame 11, membrane 12, and alignment marks 13. Complementary alignment marks 21 are located on the substrate and face the mask alignment marks 13. Relative Position Adjuster 15 moves substrate 20 to achieve alignment as described below.

Figure 2:
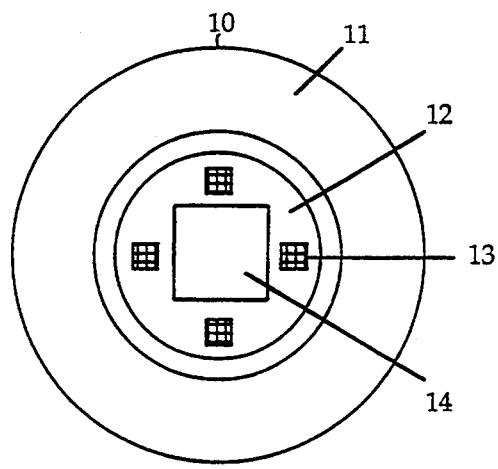
FIG. 2 is a plan view of the mask showing alignment marks.

FIG. 2 is a plan view of mask 10, showing four alignment marks 13. The central region of mask 10 includes pattern region 14 which contains the pattern that is to be superimposed over a pattern on the substrate.

Figure 3:
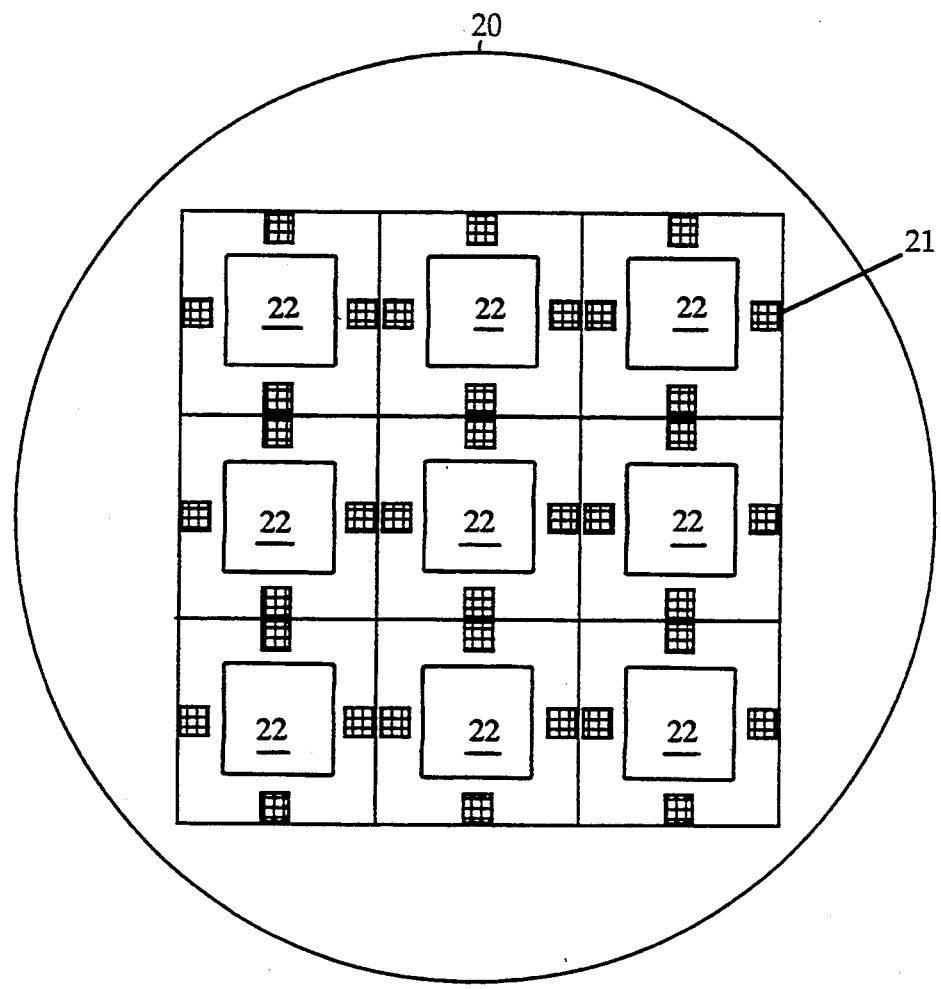
FIG. 3 is a plan view of the substrate showing multiple identical regions to be exposed.

FIG. 3 is a plan view of the substrate containing multiple identical regions of patterns 22 over which mask pattern 14 is to be superimposed in a sequence of three steps: (1) move to one of the multiple sites; (2) align mask alignment marks with respect to substrate alignments marks; (3) expose mask pattern 14 on top of substrate pattern 22.

Figure 4:
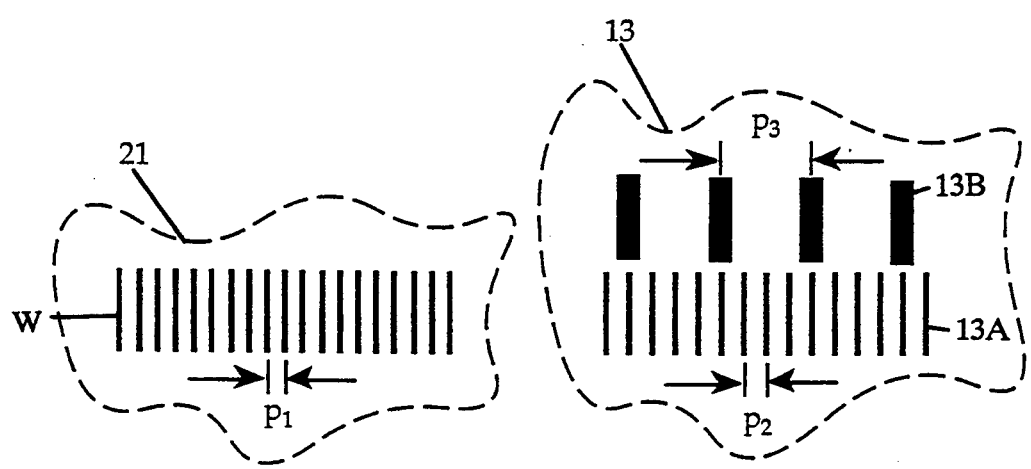
FIG. 4 shows one form of complementary alignment marks according to the invention.

An important aspect of the invention is the arrangement of the pairs of complementary alignment marks. FIG. 4 shows one type in which the substrate alignment mark 21 is a simple linear grating having spatial period $p_1$. The mask alignment mark 13 is also a simple linear grating 13A but having a different spatial period, $p_2$. Adjacent to grating 13A having period $p_2$ is a fiducial reference grating 13B having a period $p_3$ which is coarser than both $p_1$ and $p_2$. The periods $p_1$, $p_2$ and $p_3$ are chosen so that $$p_3 = \frac{p_1 p_2}{|p_2 - p_1|} \quad (1)$$

where $p_3$ is the period of the interference pattern formed by the overlap of beams diffracted by the gratings $p_1$ and $p_2$.

For example, if $p_1$ is given a value of 1 micrometer and $p_2$ the value 1.04 micrometers then $p_3$ would be 26 micrometers. Visible or near-infrared light is preferably used as the illuminating source, spanning a wavelength band from 400 to 900 nm. It is preferable to assign $p_1$ and $p_2$ values about equal to twice the mean wavelength of the illuminating band. In this way, with normal incidence illumination, the second order diffracted beams from $p_1$ and $p_2$ values about equal to twice the mean wavelength of the illuminating band. In this way, with normal incidence illumination, the second-order diffracted beams from $p_1$ and $p_2$ are either "cut off" (i.e. no second order beams exist) or they occur at close to 90 degrees, since the condition for the second order diffraction angle is $$\sin \theta = 2\lambda/p \quad (2)$$

When the second-order diffraction is cut off (i.e., $\sin \theta > 1$) the first-order diffraction occurs at 30 degrees, which permits the diffracted beams from $p_1$ or $p_2$ to intercept a large fraction of the complementary mark, provided the width of the mark, W, is larger than the mask-substrate gap G. Preferably, W should be larger than 2G. The gap G ranges from a few micrometers to 40 micrometers in current versions of x-ray lithography. Preferably, the alignment mark should include 10 or more periods, that is $W > 10p_1; W > 10p_2$.

Figure 5:
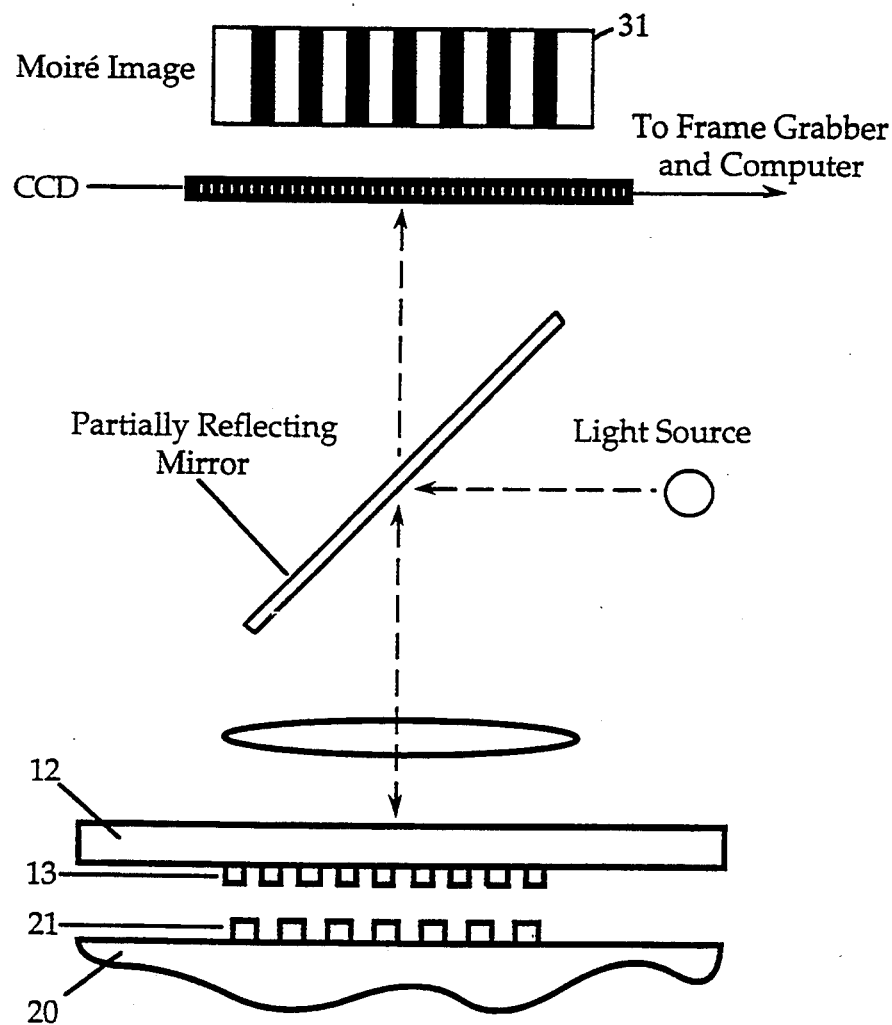
FIG. 5 schematically illustrates viewing the pairs of alignment marks with a microscope.

FIG. 5 is a schematic diagram illustrating the viewing of the pairs of facing alignment marks 21 and 13 by a microscope, in which the image of the two alignment marks and the associated interference pattern are cast onto an imaging device such as a charge-coupled device (CCD). This image can, in turn, by captured by a "frame grabber" which, in effect, stores in a computer memory a numerical representation of the light intensities registered by each picture cell or "pixel" of the CCD. Once the image is so stored in the computer memory, various signal processing algorithms can be employed to compare the interference pattern of period $p_3$ to the stationary fiducial reference grating on the mask, which also has the period $p_3$, and extract the spatial phase difference between the two. Alignment is defined as the attainment of a specific phase difference. For example, the phase difference that we define as alignment could be zero.

Figure 6:
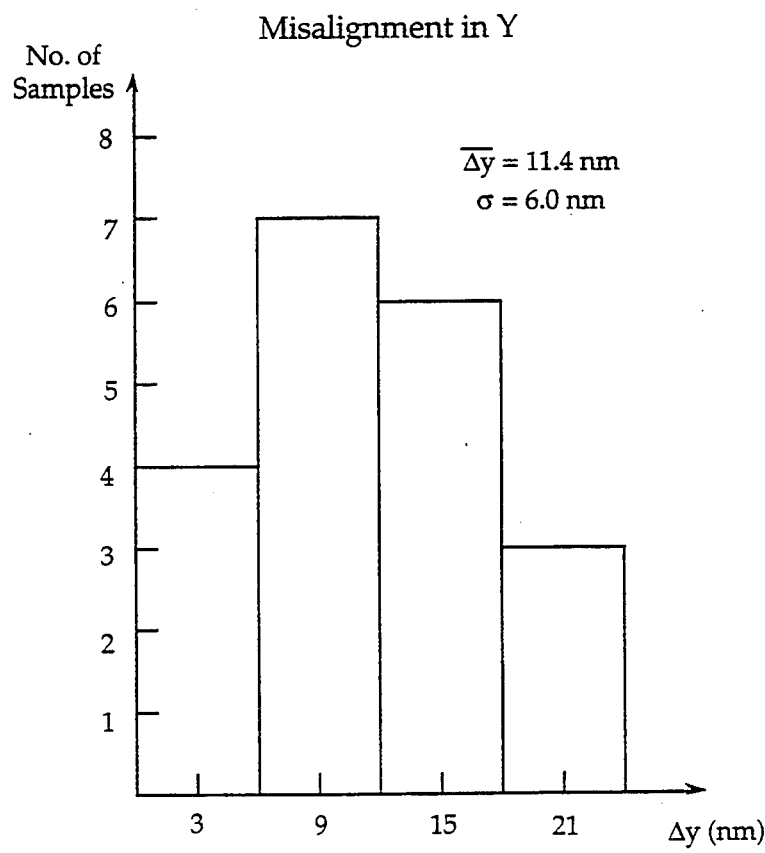
FIG. 6 shows a histogram of results from 20 alignment experiments with the invention.

Using this scheme, high precision alignment has been achieved, as shown in FIG. 6, which is a histogram of results from 20 separate alignment experiments. This alignment scheme, the apparatus, the implementation and the demonstration given in FIG. 6 are described in the Ph.D. thesis of Alberto Moel Modiano, submitted to MIT in October 1992, and incorporated by reference herein.

Figure 7:
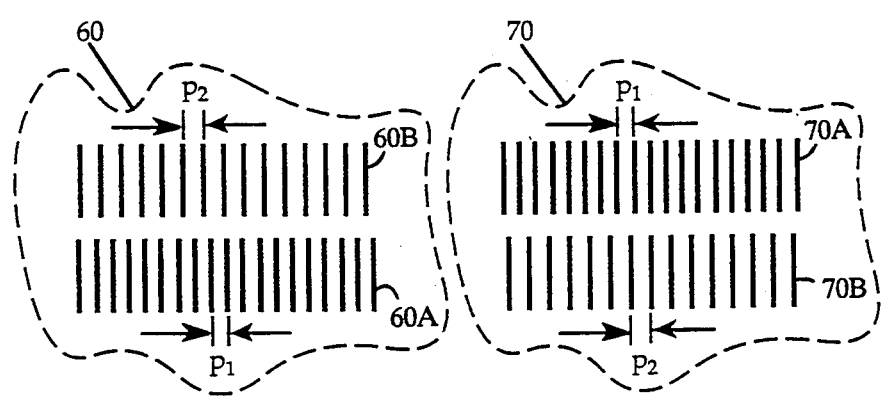
FIG. 7 shows an especially advantageous arrangement of alignment mark pairs according to the invention.
Figure 8:
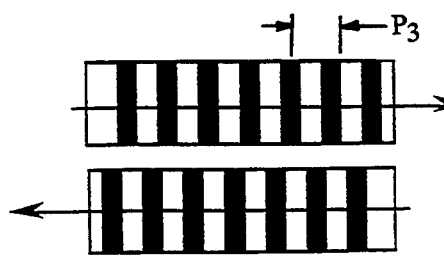
FIG. 8 shows interference patterns when mask and substrate are relatively displaced perpendicular to the lines of a grating pair.

FIG. 7 illustrates an advantageous arrangement of alignment mark pairs. The substrate mark 60 consists of two gratings 60A and 60B having periods $p_1$ and $p_2$, respectively. The mask alignment mark 70 also consists of two gratings 70A and 70B having periods $p_1$ and $p_2$, respectively, but they are arranged such that when mask and substrate are facing one another in the exposure configuration shown in FIG. 1, the $p_1$ grating 60A on the substrate faces the $p_2$ grating 70B on the mask, and the $p_2$ grating 60B on the substrate faces the $p_1$ grating 70A on the mask. The interference patterns thereby produced have the same spatial period $p_3$. However, if mask and substrate are translated laterally relative to one another, perpendicular to the lines of a grating pair, the interference patterns move in opposite directions, as shown in FIG. 8.

The apparatus of FIG. 5, consisting of microscope or imaging lens, CCD, frame grabber and the computer, together with appropriate software can determine the spatial phase difference between the two oppositely directed interference patterns. One can define alignment as the attainment of a specific phase difference between the two interference patterns. For example, one could define alignment as the condition where the two phases exactly match. Since the two interference patterns that are being compared have the same appearance, that is, the same contrast and signal-to-noise, the identification of a specific phase difference (i.e. alignment) is subject to less error than in any other type of known alignment mark.

The rest of the system, which we call OAIAS for "on-axis interferometric alignment scheme" is conventional and can be assembled from commercially available parts. The imaging lens/CCD combination must have sufficient resolution to "see" the interference pattern of period $p_3$. Preferably it should not be able to resolve the individual lines of gratings $p_1$ and $p_2$. This is easily accomplished by properly choosing the numerical aperture (NA) of the imaging lens via the well known formula $$\lambda/NA \lesssim p_3. \quad (3)$$

For $\lambda \sim 600$ nm and with $p_3 = 6$ micrometers we have $NA > 0.1$, which is readily available. Preferably, the magnification M of the interference pattern of period $p_3$ on the CCD should be such that $M \cdot p_3$ is more than two times larger than the size of the CCD pixel. That is, the CCD must take more than 2 samples per period $M \cdot p_3$. Preferably, several samples are taken per period $M \cdot p_3$. Thus, if $p_3 = 10$ micrometers and the pixel size is also 10 micrometers the lens magnification should be greater than 2. The results of FIG. 6 are obtained with a magnification of $20\times$.

Figure 9:
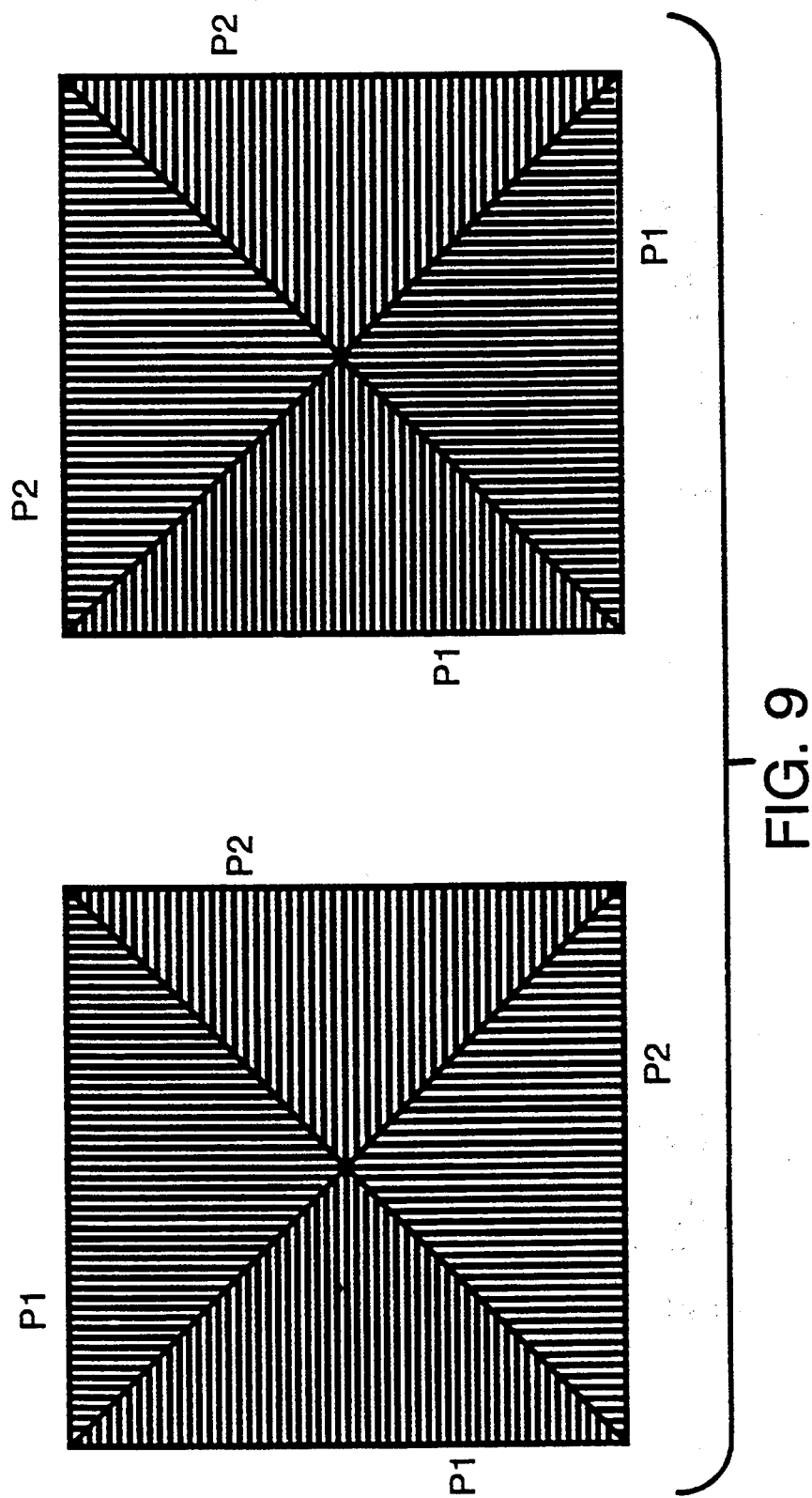
FIG. 9 shows an elaboration of the alignment mark pairs shown in FIG. 7.
Figure 10:
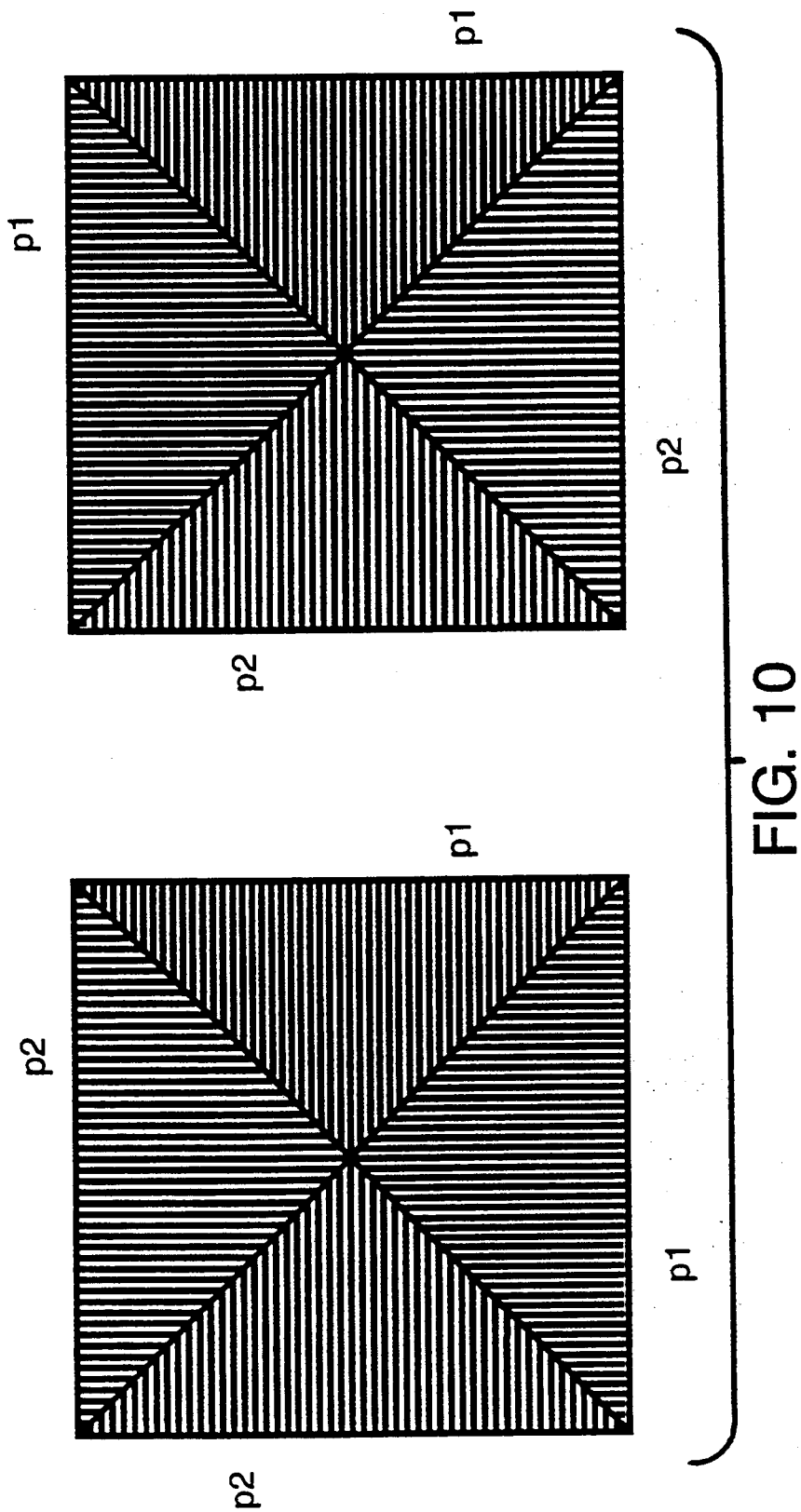
FIG. 10 shows the alignment mark pair complementing that of FIG. 9.
Figure 11:
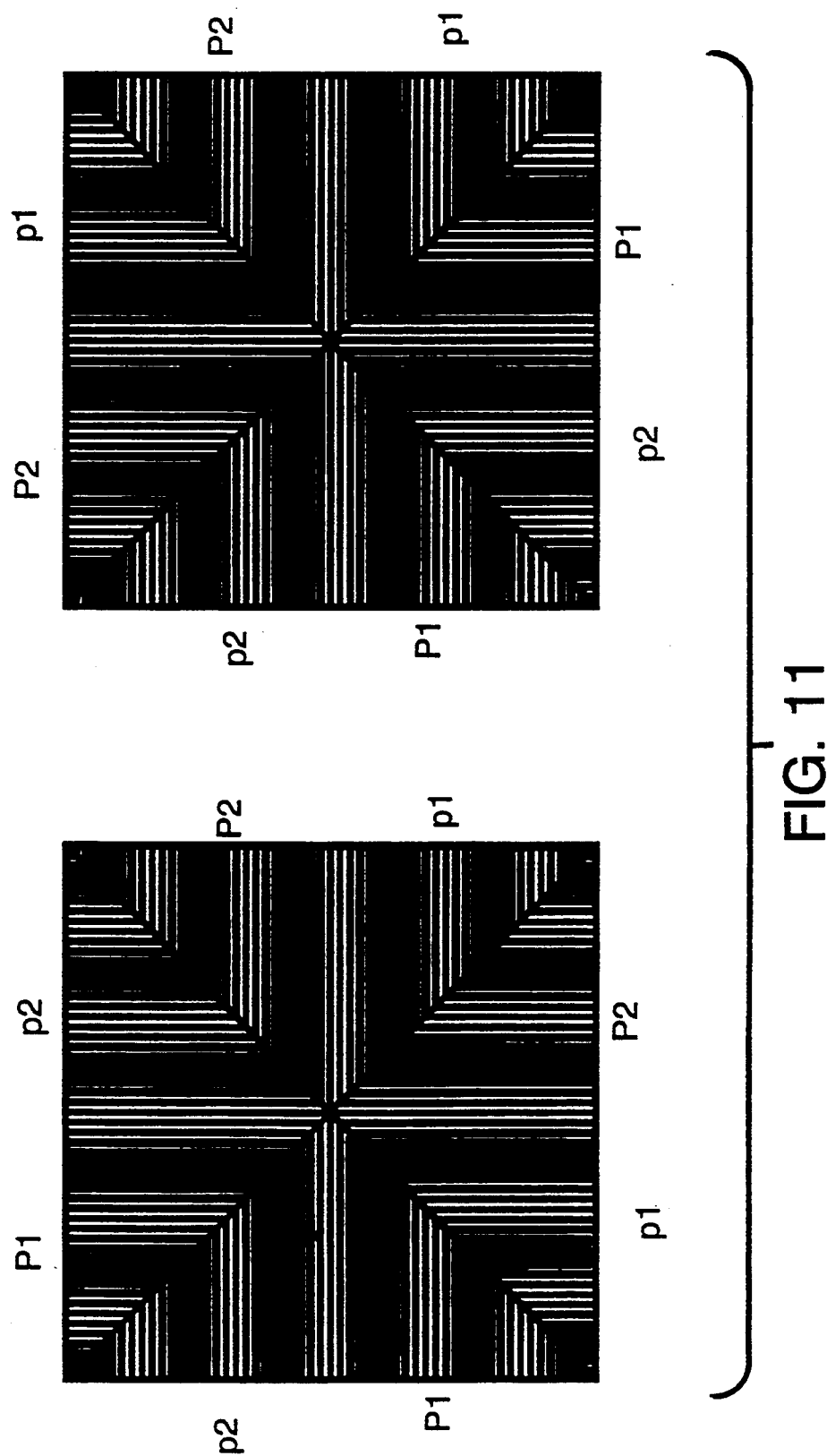
FIG. 11 shows the interference pattern formed when the alignment marks of FIGS. 9 and 10 are properly superimposed.
Figure 12:
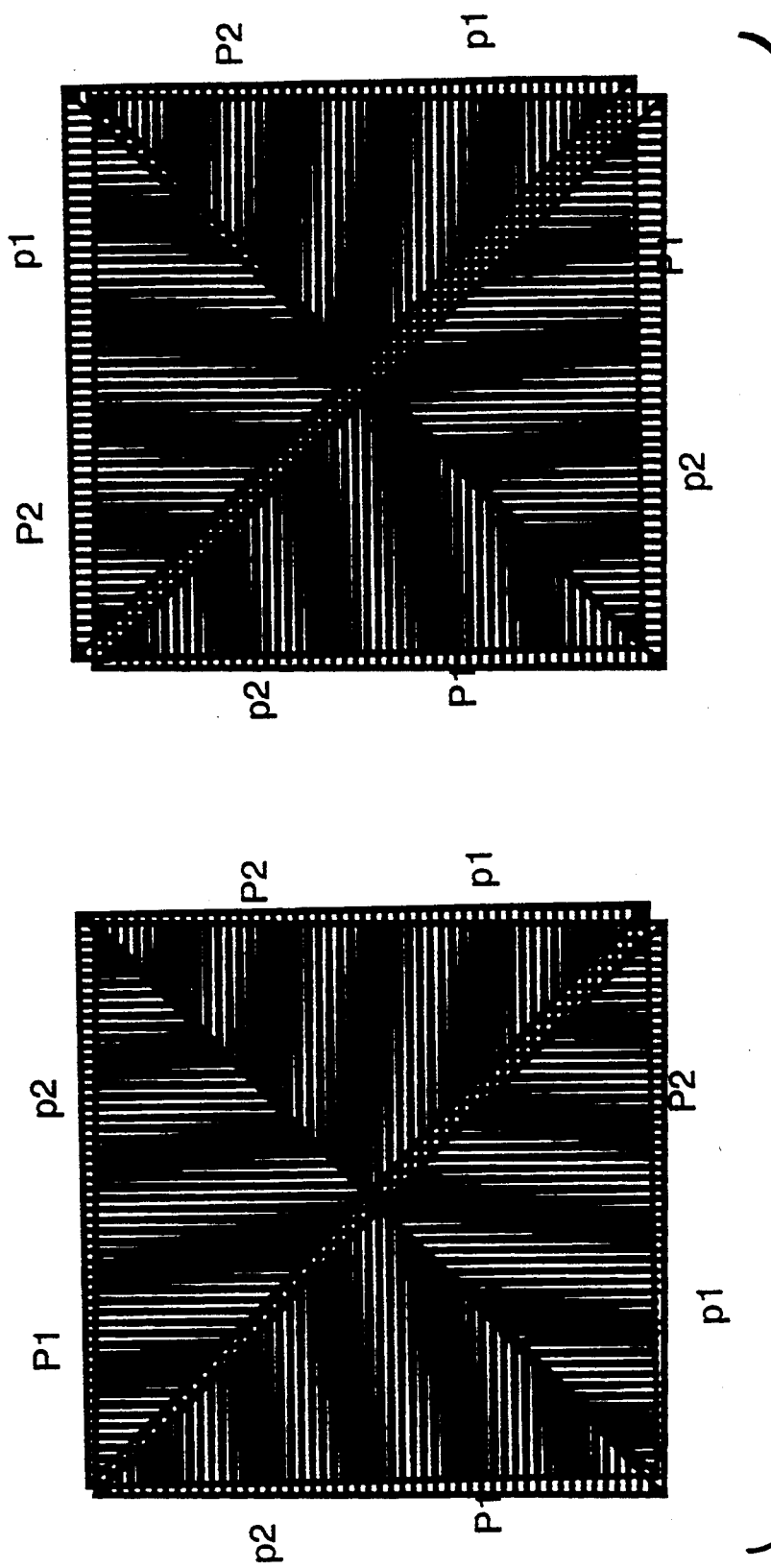
FIG. 12 shows the interference pattern when the alignment marks of FIGS. 9 and 10 are misoriented.

A further elaboration and specific embodiment of the alignment mark scheme of FIG. 7 is shown in FIG. 9. Here the two alignment marks, one on the left side of the mask field and the other on the right side of the mask field, each consists of four quadrants, with periods and orientations as shown. When such an alignment mark pair is superimposed on top of a mirror image of itself, such as illustrated in FIG. 10, the x-oriented $p_1$ gratings face x-oriented $p_2$ gratings, and y-oriented $p_1$ gratings face y-oriented $p_2$ gratings. The mirror imaged pair of alignment marks could, for example, be patterned onto a substrate to which the mask was to be aligned. When such alignment marks are properly superimposed, the interference pattern is as shown in FIG. 11. A misoriented pair is shown in FIG. 12. Thus, such alignment marks can be used to provide information on alignment in both X and Y directions.

It is obvious to anyone skilled in the art and science of microlithography and nanolithography that the alignment methods described herein are not restricted to x-ray lithographic applications but may, in fact be used in other forms of lithography, and also outside the field of lithography, in any applications where one movable plate is to be aligned with respect to another.

Other embodiments are within the claims.

What is claimed is:

1. Alignment apparatus for aligning first and second relatively movable plates, comprising:
   on a face of each of said first and second plates, first and second alignment marks respectively, each being a linear grating of parallel lines of uniform spatial period, the spatial periods being different from each other to form first and second linear grating patterns respectively;
   a light source for illuminating the second linear grating on said second plate through the first linear grating on said first plate to produce an interference pattern having a spatial phase;
   indicia on one of said first and second plates forming a periodic reference pattern having a spatial phase;
   a detector configured to detect when the spatial phase of said interference pattern and the spatial phase of said reference pattern differ by a predetermined value; and
   a position adjustor for adjusting the relative position of said first and second plates until said detector detects a spatial phase difference of said predetermined value.

2. The alignment apparatus of claim 1 wherein said indicia forming said periodic reference pattern comprise a reference linear grating on one of said plates.

3. The alignment apparatus of claim 2 wherein
   said first linear grating pattern has a spatial period $p_1$;
   said second linear grating pattern has a spatial period $p_2$;
   said reference linear grating lies adjacent to one of said first or second linear grating patterns, and comprises a grating pattern of spatial period $p_3$ being equal to $p_1 \times p_2 / |p_1 - p_2|$.

4. The alignment apparatus of claim 2 wherein said first and second plates comprise a semiconductor substrate and a lithography mask.

5. The alignment apparatus of claim 1 wherein:
   said first and second alignment marks each comprise first and second portions, the first portions of said first and second alignment marks cooperating to form a first interference pattern that moves in a first direction as said first plate is moved over said second plate, and the second portions cooperating to form said reference pattern, the reference pattern being a second interference pattern that simultaneously moves in a second direction opposite said first direction; and
   said position adjustor is for adjusting the relative position of said first and second plates to achieve a predetermined spatial phase relationship of said first and second interference patterns.

6. The alignment apparatus of claim 5 wherein:
   said first portion of said first alignment mark and said second portion of said second alignment mark comprise linear gratings having spatial period $p_1$; and
   said second portion of said first alignment mark and said first portion of said second alignment mark comprise a linear grating having spatial period $p_2$ different than $p_1$.

7. The alignment apparatus of claim 5 wherein:
   said first and second alignment marks each further comprise third and fourth portions being linear grating patterns generally perpendicular to the gratings of said first and second portions, the third portions of said first and second alignment marks cooperating to form a third interference pattern that moves in a direction as said first plate is moved over said second plate, and the fourth portions cooperating to form a second reference pattern being a fourth interference pattern that simultaneously moves in the opposite direction from said third interference pattern; and
   said adjusting step comprises adjusting the relative positions of said two plates to achieve a predetermined phase relationship of said third and fourth interference patterns.

8. The alignment apparatus of claim 5 wherein said first and second plates comprise a semiconductor wafer and a lithography mask.

9. The alignment apparatus of claim 1 wherein said first and second plates comprise a semiconductor wafer and a lithography mask.

10. A method of aligning first and second relatively movable plates, the first plate having a first alignment mark comprising a first linear grating pattern having a first spatial period, and the second plate having a second alignment mark comprising a second linear grating pattern having a second spatial period different from said first spatial period, one of said first and second plates having indicia forming a periodic reference pattern having a phase which method includes,
    bringing said first and second alignment marks together into coarse alignment with said first linear grating pattern parallel to said second linear grating pattern;
    illuminating the first and second grating patterns to form an interference pattern therebetween having a phase; and
    adjusting the relative position of said first and second plates until the phase of the interference pattern bears a predetermined relationship to the phase of said reference pattern.

11. The method of claim 10 wherein said reference pattern is related to a reference linear grating on one of said plates.

12. The method of claim 11 wherein
    said first linear grating pattern has a spatial period $p_1$;
    said second linear grating pattern has a spatial period $p_2$; and
    said reference linear grating lies adjacent to one of said first or second linear grating patterns, and comprises a grating pattern of spatial period $p_3$ being equal to $p_1 \times p_2 / |p_1 - p_2|$.

13. The method of claim 11 wherein said first and second plates comprise a semiconductor substrate and a lithography mask.

14. The method of claim 10 wherein
    said first and second alignment marks each comprise first and second portions, the first portions of said first and second alignment marks cooperating to form a first interference pattern that moves in a direction as said first plate is moved over said second plate, and the second portions cooperating to form said reference pattern, the reference pattern being a second interference pattern that simultaneously moves in the opposite direction; and said adjusting step comprises adjusting the relative positions of said two plates to achieve a predetermined phase relationship of said first and second interference patterns.

15. The method of claim 14 wherein:

said first portion of said first alignment mark and said second portion of said second alignment mark comprise linear gratings having spatial period $p_1$; and said second portion of said first alignment mark and said first portion of said second alignment mark comprise a linear grating having spatial period $p_2$ different than $p_1$.

16. The method of claim 14 wherein:

said first and second alignment marks each further comprise third and fourth portions being linear grating patterns generally perpendicular to the gratings of said first and second portions, the third portions of said first and second alignment marks cooperating to form a third interference pattern that moves in a direction as said first plate is moved over said second plate, and the fourth portions cooperating to form a second reference pattern being a fourth interference pattern that simultaneously moves in the opposite direction from said third interference pattern; and said adjusting step comprises adjusting the relative positions of said two plates to achieve a predetermined phase relationship of said third and fourth interference patterns.

17. The method of claim 14 wherein said first and second plates comprise a semiconductor wafer and a lithography mask.

18. The method of claim 10 wherein said first and second plates comprise a semiconductor wafer and a lithography mask.

* * * * *